(12) United States Patent
Subbiah

(10) Patent No.: US 7,564,861 B1
(45) Date of Patent: Jul. 21, 2009

(54) SYSTEMS AND METHODS FOR COMPRESSING DATA

(75) Inventor: Barani Subbiah, Sunnyvale, CA (US)

(73) Assignee: 3Com Corporation, Marlborough, MA (US)

( * ) Notice: Subject to any disclaimer, the term of this patent is extended or adjusted under 35 U.S.C. 154(b) by 1242 days.

(21) Appl. No.: 10/225,986

(22) Filed: Aug. 22, 2002

(51) Int. Cl.
*H04L 12/54* (2006.01)
(52) U.S. Cl. .................. 370/428; 382/235; 382/244
(58) Field of Classification Search ................ 370/328, 370/395.1, 395.64, 395.65, 428, 429, 230, 370/230.1, 235; 382/166, 232, 233, 235, 382/244, 245, 246, 247
See application file for complete search history.

(56) References Cited

U.S. PATENT DOCUMENTS

| | | | |
|---|---|---|---|
| 4,654,867 A | 3/1987 | Labedz et al. | |
| 4,697,281 A | 9/1987 | O'Sullivan | |
| 4,907,081 A * | 3/1990 | Okamura et al. ....... | 375/240.01 |
| 4,991,197 A | 2/1991 | Morris | |
| 4,998,289 A | 3/1991 | Rabe et al. | |
| 5,168,516 A | 12/1992 | Ito | |
| 5,386,590 A | 1/1995 | Dolan | |
| 5,396,519 A | 3/1995 | Betts et al. | |
| 5,452,289 A | 9/1995 | Sharma et al. | |
| 5,453,986 A | 9/1995 | Davis et al. | |
| 5,471,470 A | 11/1995 | Sharma et al. | |
| 5,479,480 A | 12/1995 | Scott | |
| 5,479,587 A * | 12/1995 | Campbell et al. .......... | 358/1.17 |
| 5,483,576 A | 1/1996 | Staples | |
| 5,500,859 A | 3/1996 | Sharma et al. | |
| 5,507,033 A | 4/1996 | Dolan | |
| 5,553,160 A * | 9/1996 | Dawson ...................... | 382/166 |
| 5,590,403 A | 12/1996 | Cameron et al. | |
| 5,648,989 A | 7/1997 | Ko | |
| 5,666,659 A | 9/1997 | Kernahan et al. | |
| 5,684,834 A | 11/1997 | Betts et al. | |
| 5,742,599 A * | 4/1998 | Lin et al. ................ | 370/395.65 |
| 5,982,937 A * | 11/1999 | Accad ......................... | 382/239 |
| 6,052,488 A * | 4/2000 | Takahashi et al. ........... | 382/239 |
| 6,404,335 B1 * | 6/2002 | Ohno et al. .................. | 340/505 |
| 6,434,168 B1 * | 8/2002 | Kari ........................... | 370/521 |
| 6,643,402 B1 * | 11/2003 | Okada ........................ | 382/232 |
| 6,738,351 B1 * | 5/2004 | Qureshi et al. .............. | 370/235 |
| 7,477,789 B2 * | 1/2009 | Chao et al. .................. | 382/232 |
| 2003/0090397 A1 * | 5/2003 | Rasmussen ................... | 341/51 |
| 2005/0143981 A1 * | 6/2005 | Koyanagi ................... | 704/211 |
| 2006/0115166 A1 * | 6/2006 | Sung et al. .................. | 382/239 |

* cited by examiner

*Primary Examiner*—Chi H. Pham
*Assistant Examiner*—Kevin Mew

(57) ABSTRACT

A method for predicting the compression rate of a particular compression algorithm upon a data stream before applying the compression algorithm to the data stream. The method utilizes a predefined threshold value and an estimated compression rate to determine whether the data stream should be compressed. If the estimated compression rate is below the threshold value, the compression algorithm will not be applied to the data stream. If the estimated compression rate is above the threshold, the compression algorithm will be applied. For example, if a series of data streams are transmitted over a wireless connection, the claimed method will determine which data streams can be successfully compressed and which data streams have already been compressed.

9 Claims, 4 Drawing Sheets

SYSTEMS AND METHODS FOR COMPRESSING DATA

BACKGROUND OF THE INVENTION

1. The Field of the Invention

The present invention relates generally to the field of data compression. More specifically, embodiments of the present invention relate to systems and methods for selectively providing data compression on a data stream.

2. The Relevant Technology

Information theory is a branch of mathematics that was largely developed in the late 1940's. In general, information theory pertains to the identification and measurement of statistics and characteristics of information. For example, information theory techniques are often used to optimize the efficiency of computer communications. One such area is data compression, where data can be represented with a decreased number of bits Data compression refers generally to the process of transforming data into a smaller or "compressed" version of itself from which the original data, or close approximation thereof, can be reconstructed at a later time. This compressed data advantageously preserves valuable data storage space and reduces the amount of bandwidth needed on a communications link and thereby allowing faster data transmission rates. As is well known, in computer data communications, the ability to provide faster transmission rates is extremely important—especially when communicating in channels having bandwidth constraints.

Two primary data compression techniques exist. One technique is commonly referred to as "lossy" data compression and the other is referred to as "lossless" data compression. Lossy data compression is a compression technique that allows the reconstructed data to vary from the original data upon the condition that the "essence" of the original data is preserved. Although this technique concedes a certain amount of accuracy during reconstruction, lossy data compression typically allows for relatively large compression ratios. Often, a fidelity criterion is introduced into lossy compression so that some measure of consistency between the original data and the reconstructed data can be expected by its users.

Until recently, lossy compression has been predominantly implemented by dedicated hardware devices. Now many powerful lossy software programs have been introduced. Typical software algorithms using lossy techniques include JPEG (Joint Photographic Experts Group) and MPEG (Motion Pictures Expert Group). These and other algorithms have proved extremely successful for lossy compression of sound files, such as digitized voice, and graphic images. This is because sound and picture formats are frequently associated with other industries, such as music and video, that customarily introduce inaccuracies into recorded or reconstructed format versions.

On the other hand, lossless data compression consists of numerous techniques guaranteeing an exact duplication between the original and reconstructed data. There are a number of examples of lossless data compression techniques are lossless, of which, statistical and dictionary are predominant.

Statistical data compression techniques generally encode a single symbol at a time by using the probability of a character based upon its appearance. The simplest of statistical compression techniques uses a static table of probabilities. An example of this is an order-0 table that creates a probability of occurrence for a character without considering the previous character. Thus, the letter "u" might be assigned a 1% probability of occurrence. Another example is an order-1 table which, in contrast, creates a probability of occurrence for a character as a function of the previous character. Thus, the letter "u" might have a probability of occurrence of 98% if the previous letter is a "q." However, static tables experience difficulty and are not always desirable. For example, to function correctly, the table (or the statistics used to build the table) must be passed to the decompressor in order to reconstruct the original data.

Although, this passage, or "overhead," may only take about 256 bytes with an order-0 static table, an order-1 table, in contrast, might require as many as 65,536 bytes, or more. Thus, if an order-1 table or greater is used, the overhead of passing the table will most likely eradicate any gains potentially achievable by the table.

For this reason, many statistical compression techniques are "adaptive," which provides several advantages. For example, with an adaptive technique, data does not have to be scanned before coding in order to generate statistics. Instead, the statistics are continually modified as new characters are read in and coded. However, this gives rise to a problem with the technique. When the compression starts, nothing is known about the data and the compression must "warm up." Although compression ratios are greatly improved after only about a few thousand bytes, the initial compression is ineffective. This warm-up phenomenon is known commonly as "acceleration."

Dictionary data compression uses a single code to replace variable length strings of symbols. In general, a dictionary technique reads in data and looks for groups of symbols that appear in the dictionary. If a match is found, a pointer or index into the dictionary can be output instead of the code for the symbol. The longer the match, the better the compression. In general, dictionaries are either static or adaptive. A static dictionary is used like a list of references in a published paper where reference to other authorities is marked by a single number. Static dictionaries have the advantage of being able to "tune" their dictionaries to fit the data that is being compressed. Static dictionaries, like static tables of probabilities, however, are problematic because of the excessive overhead required to transmit the dictionary from the encoder to the decoder. Thus, adaptive dictionaries are used to overcome this problem.

In general, adaptive dictionaries are continually modified as new characters are read in and coded. Again, adaptive dictionaries, like adaptive statistical tables, have poor initial compression characteristics during its acceleration period.

Two very well known examples of dictionary algorithms include the LZ77 and the LZ78. Progeny of these algorithms are numerous and have been used for both dictionary and statistical lossless data compression. They have even been used as hybrid statistical-dictionaries. Some of these better known progeny include commercial products, programs and algorithms such as the LZW, QIC-122, ARC, PKARC, PKZIP, LHarc, V.42bis, MNP-5, DCLZ, ARJ, PNG and GIF.

No matter which data compression technique is used, the traditional architecture used to compress and transmit data (or receive and decompress data) is usually configured as a singular compression channel. This compression channel typically includes a singular processing element, such as a digital signal processor (DSP), a singular data processing element, such as a microprocessor and a singular interface such as a processor bus or a data communication equipment (DCE) device. Although productive, such traditional architectures are plagued by shortcomings.

For example, consider the general situation when a user at a remote location desires to retrieve or access data files from a network or group of networks. In such a situation the user often uses a computer and modem (or similar device) to access a remote access server across a communications channel. This remote access server then acts as a gateway or passage mechanism by which the user gains access to the network(s).

Often, each individual network accessed by the user will have its own communication protocol. Yet, certain types of communication protocols have multiple logical channels therein which can allow the simultaneous processing of multiple data streams. As a result, a singular communications protocol can have numerous data streams therein. An example of this is a TCP/IP communications protocol having an HTML, E-Mail, FTP, source code, such as C and JAVA, text, and WAVE data stream simultaneously flowing therein.

One of the main problems with singular compression channels is manifest when the communication protocol appends a header to the data stream. In general, headers are used to facilitate and track the administrative and procedural tasks required to send data from one computing system configuration to another. Although many headers are compressed and have generally been pre-optimized to minimize the number of bits that must be used to convey data, putting a compressed header through a data compressor that adapts its dictionary to the statistics of the data stream will often result in degraded compression performance. This is because the dictionary will try and adapt to the statistics of a header that cannot be compressed any further. The result is a dictionary that never reaches a level where efficient coding of the redundant data following the compressed header can occur.

Even further compounding this problem is when successive headers are appended together. An example of this is when the transmission control protocol (TCP) attaches a header to each data stream before handing them off to the Internet Protocol (IP). In such a situation, the data stream looks like: IPheader+TCPheader+data stream. Thereafter, if this data stream is handed off to a network, such as a Package Data Network (PDN) where an X.25 ITU communications standard is used, the X.25 breaks the data stream into 128 byte packets, each with their own X.25 header. Thus, the data stream expands from the data stream and TCP/IP headers into: X.25header+IPheader+TCPheader+data stream. If the data stream itself is character-based, such as with FTP, XTERM, RLOGIN or TELNET, the TCP/IP headers alone can be 40 bytes long, or more, for each byte of data transferred. Consequently, application of a compression technique to this type of data stream—which is already largely compressed—would be highly inefficient, thereby eliminating much of the efficiency being sought via compression.

Thus, it would be highly desirable to provide a system and method that is capable of first identifying the state of compression of a particular data stream before further data compression is applied. In this way, if a data stream has already been previously compressed—such as in the circumstances described above—no further data compression will be attempted, thereby increasing the overall efficiency of the system. Such an approach would address many of the foregoing problems of utilizing a blind singular compression channel.

SUMMARY OF PREFERRED EMBODIMENTS

These and other problems in the prior art are addressed by embodiments of the present invention, which generally relate to systems and methods for estimating the compression rate that may be achieved upon a data stream before the compression algorithm is applied to the entire data stream. If the estimated compression rate falls below a defined threshold value—indicating, for example, that the data has already been compressed—then the compression algorithm will not be applied to the data stream. In contrast, if the potential estimated compression rate is above the threshold—indicating that the data can be further compressed—the compression algorithm is applied to the data stream. For example, if a series of data streams are transmitted over a wireless connection, the claimed method will determine which data streams can be successfully compressed and which data streams are already compressed as much as possible. Eliminating the unnecessary compression of those already compressed data streams greatly reduces the computational overhead of the system, and thereby increases overall communication efficiency. This is extremely desirable in most communication environments, such as a wireless communication system.

In preferred embodiments, the selective compression algorithm is implemented as an executable software module. Moreover, the software module can be implemented so as to actually execute at the network connection device, such as a local area network (LAN) network interface card (NIC), a wireless interface device, a wireless access point, and the like. In this way, the compression application is independent of and transparent to, upper level applications and operating systems of the host computing device, which greatly simplifies the installation and use of the solution. For example, the manufacturer of the network interface device can install the software module on the device, thus eliminating the need for end users to load and install software on the host computer. Moreover, upper level applications do not need to be rewritten or reconfigured in any way to take advantage of the functionality of the compression application. Of course, in certain embodiments the software module could instead be implemented in part or in whole on a host computing device.

In one exemplary embodiment, the selective compression algorithm is implemented so as to obtain an "estimate" of whether a data stream can be efficiently compressed. To do so, a predetermined number of individual data packets within a data stream are compressed. The average compression ratio of the compressed data packets is then calculated. This average compression ratio is used as an estimate of how successful the compression algorithm would be if it were to be used to compress the entire data stream. If the average compression ratio exceeds a threshold value, the entire data stream will be compressed with the compression algorithm. If the average compression ratio is below the threshold value, the method will skip the remainder of the data stream and proceed to the next data stream.

In an alternative embodiment, the algorithm continues to monitor the average compression ratio to continuously evaluate whether compression is worthwhile. Note that this approach can be useful where portions of a data stream have been compressed, and other portions have not. For example, a data stream may contain a WEB page that includes both graphics and text portions. The graphics portion may already be compressed, while the text portion is not. Thus, in a given data stream, only portions may need to be further compressed. Using this approach, when the average compression ratio falls below the threshold value, the method does not necessarily skip the remainder of the data stream. Instead, the method will, after a predetermined or random interval, re-sample the data stream and re-calculate the average compression ratio. If this re-sampled ratio exceeds the threshold value, then the data stream will be compressed from that point forward, at least until a new sample is taken and the average compression ratio falls below the threshold value. For example, by re-sampling the average compression ratio of a data stream containing a WEB page, the compression algorithm will not be performed on the graphics portion, but can be performed on the uncompressed text portion. This increases the efficiency of the overall method.

Thus, embodiments of the present invention provide a methodology whereby network data is compressed only where it is most efficient. By avoiding those data streams (or portions of data streams) that are already compressed, the method avoids any wasting of computational and network resources. This results in a much more efficient communications environment. While the approach is useful in practically any communications environment that utilizes compression of data, the application is especially beneficial in communications systems that have a limited bandwidth, such as many wireless network systems such as Bluetooth, IEEE 802.11, Wireless Wide Area Networks (WWAN) and the like.

The foregoing, together with other features and advantages of the present invention, will become more apparent when referred to the following specification, claims and accompanying drawings.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF PRESENTLY PREFERRED EMBODIMENTS

Reference will now be made to the drawings to describe presently preferred embodiments of the invention. It is to be understood that the drawings are diagrammatic and schematic representations of the presently preferred embodiments, and are not limiting of the present invention, nor are they necessarily drawn to scale.

In general, the present invention relates to a method of predicting the compression rate of a particular compression algorithm upon a data stream before applying the compression algorithm to the entire data stream. The method allows a user to set a predefined threshold value (or the system can assign a default threshold value) that must be met for a compression to be performed. The method then calculates an estimated compression rate for a given data stream (or portion of a data stream) and, if the estimated compression rate is below the threshold value, the compression algorithm will not be applied. In contrast, if the estimated compression rate is above the threshold, the compression algorithm will be applied to the data stream (or to a portion of the data stream). For example, if a series of data streams are transmitted over a wireless connection, preferred embodiments will determine which data streams can be successfully compressed and which data streams are already compressed as much as possible.

While embodiments of the present invention are described in the context of predicting the compression rate of an algorithm upon a communications data stream, it will be appreciated that the teachings of the present invention are applicable to other applications as well. For example, the present invention could be used to predict the decompression rate of a decompression algorithm on a data stream. Also, while embodiments of the present invention are described in the context of communications applications, it will be appreciated that aspects of the invention are equally applicable and valuable in other contexts as well. Indeed, the present invention may find application in any area that would benefit from a more efficient application of data compression, including data storage, etc. In addition, it will be appreciated that while embodiments are described in the context of a wireless network system, the invention as applicability to other types of network environments as well.

Figure 1:
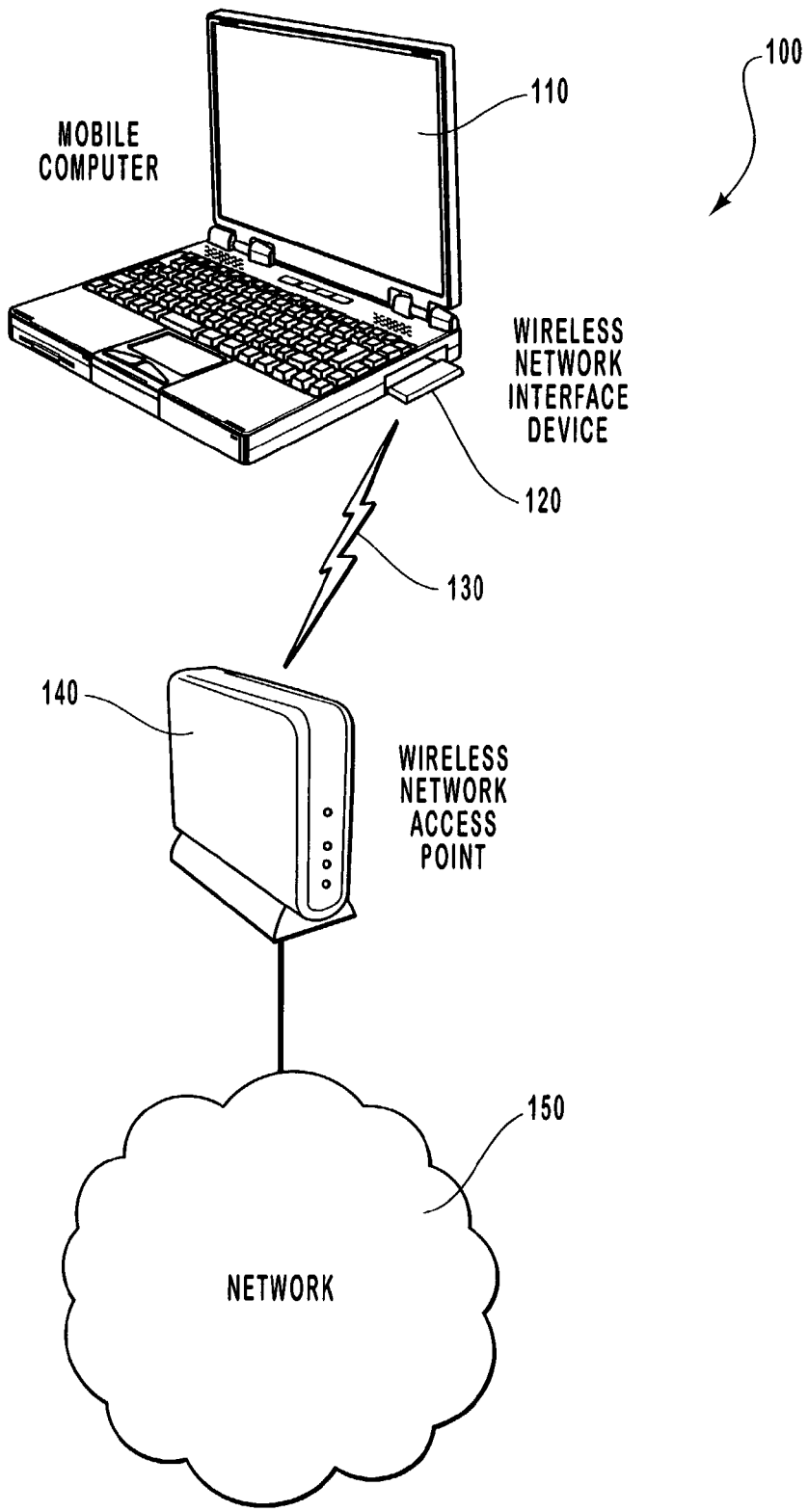
FIG. 1 is a schematic illustration of an exemplary computer network environment in which can be used a presently preferred embodiment of the method for predicting the compression rate of a compression algorithm upon a data stream before applying the compression algorithm to the entire data stream.

Reference is first made to FIG. 1, which illustrates an example of a computer network environment in which embodiments of the present invention would find particular applicability. In this particular environment, designated generally at 100, a mobile computer 110 is connected to a computer network 150. Here, the connection is provided via a wireless communications link, designated at 130, such as may be provided via Bluetooth, 802.11 and any similar type of wireless connection scheme. In this particular example, the mobile computer 110 interfaces with the wireless communications link 130 via a connected wireless network interface device 120 that converts data packets from the mobile computer 110 into the applicable wireless format and vice versa. Again, the particular format of the packet will be dependent on the wireless standard being used, such as Bluetooth and 802.11. Examples of wireless network interface devices can include PC cards, PCMIA cards, external wireless transmitters, internal PCI cards and integrated wireless devices. In the example, data packets originating from the mobile computer 110 are transferred over the wireless interface 130 to the wireless network access point 140. The wireless network access point 140 is a device that converts the wireless data packets into traditional wired electrical pulse data packets such that it can be transferred to a wire-based network, such as that shown at network 150. The wireless network access point 140 also converts data packets originating from the network 150 into the wireless format such that they can be transferred over the wireless interface 130.

Again, while FIG. 1 illustrates a particular type of environment, for purposes of description only. It will be appreciated that the environment of the present invention can have many variations and types and is also not limited to communication types of applications.

With continued reference to FIG. 1, data packets that are transferred over the wireless interface 130 are transmitted at a particular speed according to the requirements of the wireless specification being implemented. For example, Bluetooth dictates that all wireless information be transmitted over a particular radio frequency and at a particular power. These specifications limit the speed at which data can be transferred over the wireless medium. In applications such as wireless networking and internet communications, a high speed of data transmission is generally desired. Therefore, it is important to optimize the speed and efficiency at which data packets are sent across the wireless medium from the mobile computer 110 to the network 150. Since the wireless specifications limits the actual transmission rate and power at which data packets can be transferred, one tactic for increasing the overall bandwidth of the wireless link is to reduce the amount of data that is actually transmitted/received via the wireless channel. This can be accomplished by compressing the data packets before they are transmitted over the wireless interface and then decompressing them after they are transmitted over the wireless interface. For example, in the illustrated computer network environment, a data packet originating from the mobile computer 110 will be compressed by software executing at the wireless network interface device 120 and then transmitted across the wireless interface 130 in a reduced size and thus at a greater effective throughput. The data packet will then be decompressed by software executing at the wireless network access point 140 before being transferred to the network 150.

As already noted, to further enhance the overall efficiency of the system, embodiments of the present invention determine whether compression is advisable with respect to a given data stream. The process of compressing and decompressing data packets introduces a certain amount of delay before a data packet reaches its destination, and also requires a certain amount of processing resources. Thus, embodiments of the present invention avoid compression of those portions of the data stream that cannot be efficiently compressed, thereby optimizing the transmission rates. For example, different data types compress at different compression ratios and therefore, it is not efficient to compress all data being transmitted over the wireless medium 130. A compression ratio is the ratio of the original size versus the compressed size of a particular group of data. For example, a data packet containing a payload having data formatted in accordance with the MP3 compression standard cannot be efficiently compressed and therefore the compression ratio of an MP3 file will be extremely low. Thus, any attempts at further compression merely introduce computational overhead and delay into the system. In contrast, a Power Point or Microsoft Word file can be compressed a great deal further, and therefore will have a very high compression ratio. Compression of such data would contribute highly to the overall throughput of the communications environment.

Embodiments of the invention utilizes a compression technique that is used only on data streams (or portions of data streams) that will respond effectively (i.e., a high compression ratio) to the given compression algorithm. This method of only compressing and decompressing data that can be efficiently compressed and decompressed will optimize the transmission of the data packets from one destination to another by minimizing the size of the data that must be sent across a communications medium and minimizing the compression and decompression time delay introduced before and after the wireless transmission. Preferably, the method is carried out by way of a compression algorithm that is implemented as an executable software module comprised of executable software instructions. Moreover, in preferred embodiments the executable software is implemented so as to be capable of executing at, for example, the wireless network interface device 120 (to selectively compress the data) and at the wireless network access point 140 (to de-compress that portion of the data stream compressed). If configured in this way, the algorithm can be implemented in software that is independent of, and transparent to, upper level applications and operating systems that are executing at the host computing device, such as mobile computer 110 in FIG. 1. This greatly simplifies the installation and implementation and use of the solution. For example, the manufacturer of the network interface card and/or wireless network access point device can install and incorporate the executable software within the device itself, thereby eliminating the need for end users to load and install separate software modules at the host computing device. It will be appreciated that while this is a preferred implementation, alternative embodiments could be implemented in software that is instead implemented and installed in part or in whole on a host computing device.

Figure 2:
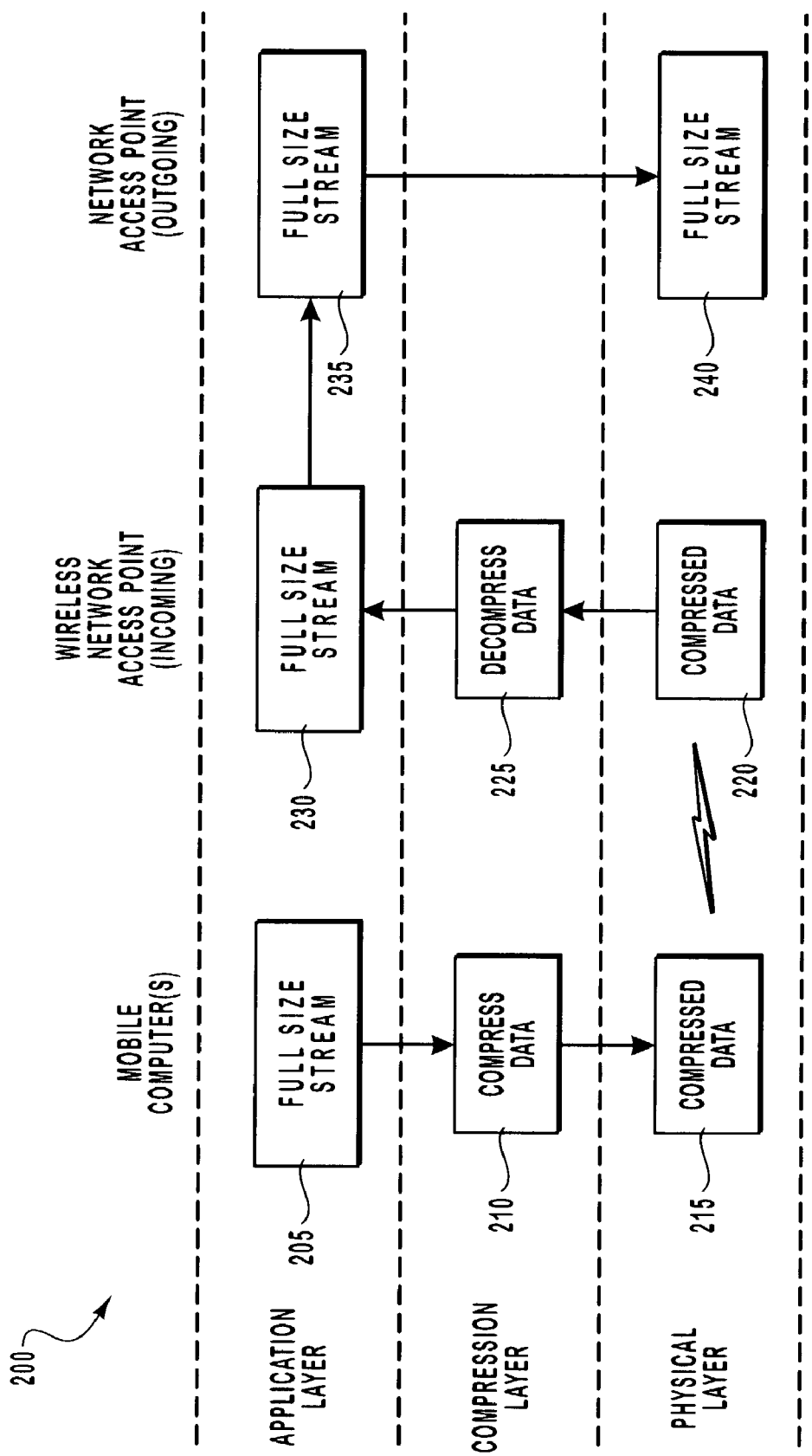
FIG. 2 is a functional block diagram illustrating functional attributes of one presently preferred embodiment of the method for predicting the compression rate of a compression algorithm upon a data stream before applying the compression algorithm to the entire data stream.

Reference is next made to FIG. 2, which illustrates a functional chart illustrating aspects of one presently preferred embodiment of the present invention, as it may be used in the context of the environment of FIG. 1. The preferred methodology is designated generally at 200. The methodology chart illustrates the transfer of data from the mobile computer (or any other applicable host computing device) via the wireless network access device 120 to the network access point 140 via a wireless channel. The data stream is then forwarded from the network access point to a different wire-based network connected device, for example. The methodology chart is broken up into three rows representing three logical portions of the stack through which a data stream, comprised of data packets, will travel. This is analogous to the 7-layer OSI model commonly used to describe different software mechanisms. For example, the application layer is the upper level layer in which the data packet will originate. This layer can correspond to any high level application that originates a data stream; for example, it could be comprised of an IP layer. Note that at this point, data stream may already be compressed, or partially compressed. The compression layer represents the additional layer, representing the functionality of the presently preferred selective compression method. Again, as noted, this is preferably implemented as executable software steps executing on a programmable device. Preferably, the software executes at the interface device itself (120 in FIG. 1) and at the access point 140 so that the functionality is transparent to, and independent of the upper level applications executing at the application layer. Finally, the physical layer represents the layer in which data is physically transferred from one location to another, such as via the wireless channel 130 of FIG. 1.

In the illustrated methodology chart of FIG. 2, a "data stream" originates from the mobile computer (or any other type of host computing device) in the upper level application layer and is transferred, for example, to the wireless network interface device 120. The data stream can be full size, meaning that it has not been compressed in any manner, or it may have already been either partially, or completely compressed at the application layer. The data is then sent down to the "selective" compression layer, which is implemented with executable software instructions, denoted here at 210, example embodiments of which are described further below in FIGS. 3 and 4. Here, the data stream 210 is selectively compressed as described below. Compression can be provided by any data compression algorithm including lossy and lossless formats. The compressed data stream 215 is then sent down to the physical layer, and wirelessly transmitted via the wireless channel. The compressed data 220 within the physical layer of the network is then wirelessly received at the access point 140 and is transferred to the de-compress functional layer. Here, the compressed data is decompressed into its original format, essentially reversing the compression process performed at 210. The decompressed data 230 is then sent up to the application layer, such as the IP layer. Here, the data stream 230 is essentially reconstructed to its original "full size." Within the wired computer network (such as 150 in FIG. 1), the data stream can then be transferred across the IP layer to another node. In this particular embodiment, the outgoing network access point transmits the data 235 to the physical layer without entering the compression layer. It will be appreciated that the example configuration of FIG. 2 may vary depending on the particular configuration and implementation. For example, the actual flow points may vary depending upon where the selective compression algorithm is implemented and executed (e.g., points other than the network interface card 120 and the wireless access point 140).

Figure 3:
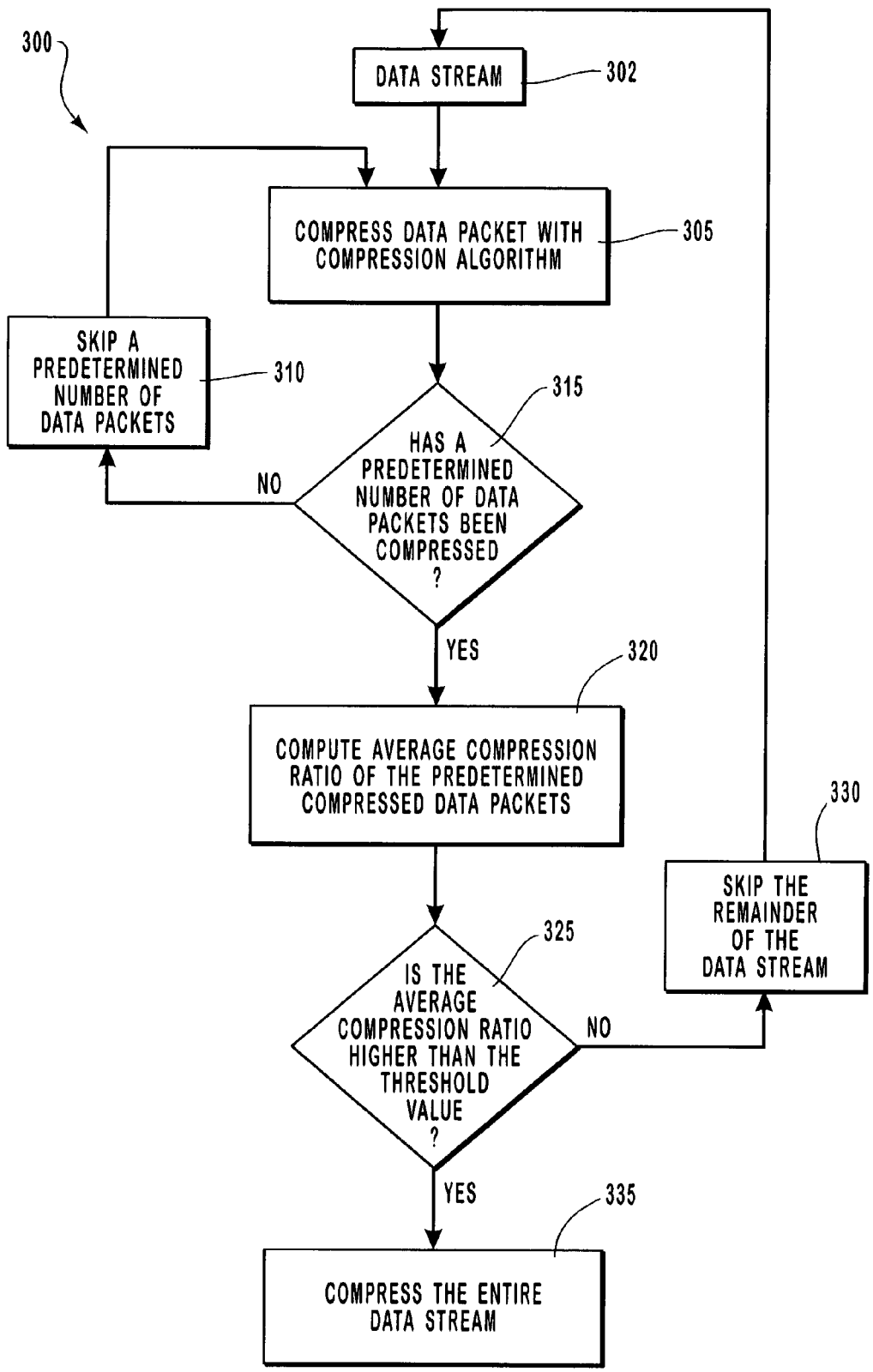
FIG. 3 is a flow chart illustrating one presently preferred embodiment of the method steps used to implement an embodiment of the present invention.

Reference is next made to FIG. 3, which is a flow chart illustrating a presently preferred embodiment of the method steps, designated generally at 300, for predicting the compression rate of a compression algorithm upon a data stream before applying the compression algorithm to the entire data stream. Preferably, the process steps are implemented via a series of programmable executable instructions that execute on a programmable processor. Again, in preferred embodiments the processor used can be implemented within the network interface device 120 (selective compression) or the network access point 140 (de-compression). Also, the executable instructions can be stored on any suitable computer storage medium that are well know to those of skill in the art, including computer solid state memories, magnetic storage media and the like. Alternatively, it will be appreciated that the methodology described and shown in FIG. 3 could be implemented exclusively in computer hardware implementations, or via a combination of dedicated hardware and software.

The logical process 300 begins at step 302 and operates on a given data stream, which corresponds to a given block of network data. In one embodiment, a data stream corresponds to a particular session within the application layer, and may be identified, for example, by destination IP address and/or TCP/IP port numbers. A predefined portion of the data stream, such as an individual network protocol data packet, is captured and compressed using a given compression algorithm, as is shown at 305. Again, any appropriate compression algorithm can be used depending on the needs of the application. The logical process 300 then inquires at program step 315 whether a predetermined number of data packets have been compressed from a particular data stream. Generally, the predetermined number should be sufficient to ensure an accurate estimate of the compressing capabilities of the compression algorithm upon the given data stream. This may vary depending on a number of factors, including the data compression scheme used, and the type of data being transmitted. This is necessary because different parts of a data stream may be able to be compressed at different rates and it is important to take an average of the individual data packets that are compressed throughout a portion of the data stream to make an accurate prediction of how the compression algorithm will effect the entire data stream. For example, a header may have a very different compression rate from the body of a typical data segment. Of course, in certain applications, compression of a single data packet may suffice to obtain a sufficient estimate. In a presently preferred embodiment, if at step 315 it is determined that a sufficient number of data packets has not yet been compressed, then processing proceeds at step 310, where a predetermined number of data packets may be skipped before another packet is compressed. Here, the number of data packets skipped before compressing another data packet can be chosen to ensure an accurate sampling of the data stream. Alternatively, no data packets are skipped, and the next subsequent data packet is used. Once the predetermined number of data packets have been compressed as determined at step 315, processing continues to program step 320, where the average compression ratio of the compressed data packets is computed. The compression ratio of each data packet is simply the ratio of the compressed data packet size to the original data packet size. For example, if a file is compressed from ten kilobytes to eight kilobytes it would be compressed at a twenty percent compression ratio. The average of the compressed data packets is obtained by adding up the compression ratios of each compressed data packet and dividing by the number of compressed data packets sampled. The process 300 then proceeds to step 325 where it is determined whether the average compression ratio is higher than a predetermined threshold value. The threshold value is a user defined value (or a system defined default value) that dictates whether or not the compression is successful enough to proceed to compress the entire data stream or whether the logical process should simply move on to the next data stream. If the average compression ratio does exceed the threshold value, then processing will proceed with program step 335 where an appropriate compression algorithm will be utilized to compress the entire data stream. If however the average compression ratio is below the threshold value, processing reverts to program step 330, and data stream is skipped. The process will then repeat for the new data stream.

Note that upon receipt at a destination node (such as a destination access point or interface card), if the data stream has been compressed it must be decompressed as previously noted in connection with FIG. 2. Here, the corresponding de-compression algorithm would be utilized. Whether a given data stream (or data packet) has been compressed can be noted in a number of ways. For example, if compression is performed at program step 355 to a given packet, that fact can be indicated in the header (e.g., a single bit set to 0 indicates no compression; set to 1 indicates compression) at the MAC layer. A more complex scheme could be utilized to even designate the type of compression algorithm used. For example, the most efficient compression algorithm could be used for a given data stream type.

Figure 4:
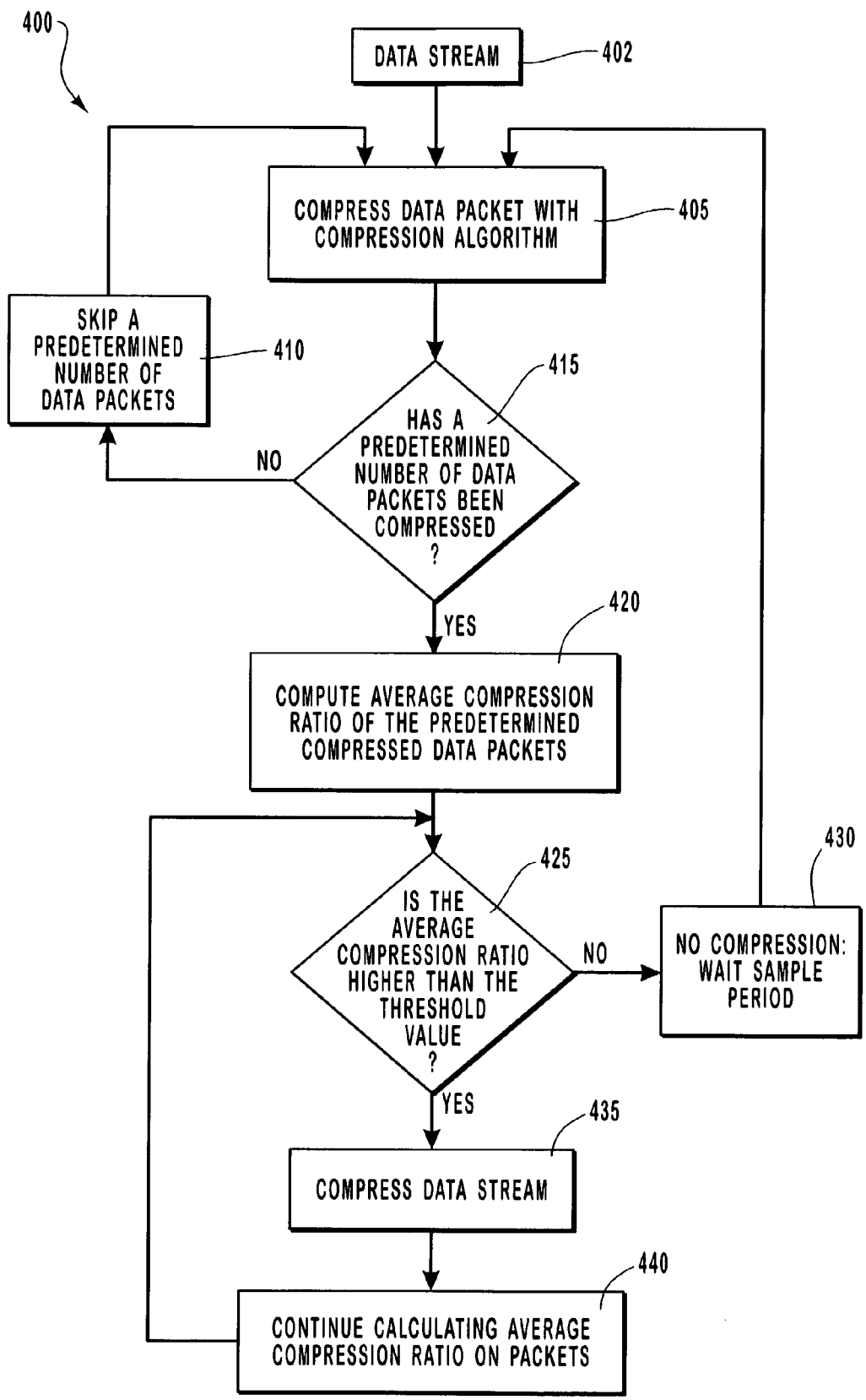
FIG. 4 is a flow chart illustrating yet another presently preferred embodiment of the method steps used to implement an embodiment of the present invention.

Reference is next made to FIG. 4 which illustrates a flow chart showing yet another embodiment of the processed steps that can be used to implement a preferred method. This process utilizes many of the same program steps as shown in FIG. 3, and those steps will not be described again here. However, in this particular embodiment, instead of computing an average compression ratio once for an entire data stream, the average is continuously monitored. In this way, a particular data stream that contains both uncompressed and compressed packets can be efficiently adjusted so as to be optimally compressed. For example, if a particular data stream corresponds to the download of a WEB page that contains both text and graphics, the algorithm shown in FIG. 4 will ensure that only the text portion is compressed which the already-compressed graphics portion is merely passed on.

Thus, in the process of FIG. 4, if at program step 425 it is determined that the average compression ratio does not exceed the threshold value, then processing will continue at program step 430. Here, a sample period is introduced. The sample period can be a fixed amount of time (for example, 100 data packets), or can be variable depending upon a particular application. Once the sample period has passed processing returns to program step 405 and a new packet within the data stream is obtained and compressed. Processing then continues, as previously described, through program step 420 so as to calculate a new compression ratio for that new portion of the data stream. If, during this new sample period, the average compression ratio does exceed the threshold value, then that portion of the data stream will be compressed. Depending upon the implementation, the remainder of the data stream can be compressed, or alternatively, the data stream can be compressed until a new sample period has passed and another compression ratio can then be computed.

For example, in the embodiment of FIG. 4, once it is determined that the average compression ratio exceeds the threshold value, and compression begins, as is indicated at process step 435, program step 440 is invoked. Here, the process continuously monitors the average compression ratio of the data stream. Again, this average can be computed based on a single packet, or upon a predetermined number of packets. It the average falls below a threshold value, this would indicate that the corresponding portion of the data stream corresponds to data that has already been previously compressed (i.e., a graphics portion of a WEB page), and further compression would be inefficient and a waste of computing resources. This condition would be detected at program step 425, and compression would stop, as is indicated at step 430. Again, the algorithm would wait a predetermined sample period, before again re-calculating an average compression ratio. This continues for the duration of the data stream. Thus, this particular embodiment insures that compression is efficiently applied (or not applied) throughout the duration of a given data stream. Again, this preserves computing resources, and results in a transmission system that utilizes available bandwidth in a much more efficient manner.

It will be evident that there are numerous embodiments of the present invention, which, while not specifically described above, are clearly within the scope and spirit of the invention. Consequently, the above description is considered to be exemplary only, and the full scope of the invention is to be determined solely by the appended claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for transmitting a data stream via a communications network, the method comprising the following steps:
    (a) compressing at a wireless network interface device a predefined portion of a data stream using a predetermined compression algorithm, said predefined portion comprising at least one network protocol data packet;
    (b) computing at said device an average compression ratio value based on the compressed portion of the data stream;
    (c) compressing at said device a remaining portion of the data stream using the predetermined compression algorithm if the average compression ratio exceeds a predetermined threshold value; and
    (d) transmitting from said device the data stream via a communications channel (i) after step (b), if the average compression ratio does not exceed said predetermined threshold value, or (ii) after step (c), if the average compression ratio exceeds said predetermined threshold value.

2. The method as defined in claim 1, wherein the method further comprises the step of repeating steps (a)-(c), prior to step (d), after waiting a predetermined sample period, if the average compression ratio does not exceed said predetermined value.

3. The method as defined in claim 1, wherein the communications channel is wireless.

4. A computer-readable medium having computer-executable instructions for performing the steps recited in claim 1.

5. A method for wirelessly transmitting a data stream via a wireless communications channel, the method comprising the following steps:
    (a) receiving at a wireless network interface device a data stream from an upper level application executing on a host computing device;
    (b) compressing at said device a predefined portion of a data stream using a predetermined compression algorithm, said predefined portion comprising at least one network protocol data packet;
    (c) computing at said device an average compression ratio value based on the compressed portion of the data stream;
    (d) if the average compression ratio exceeds a predetermined threshold value, compressing at said device the data of at least a portion of the remaining packets of the data stream using the predetermined compression algorithm;
    (e) if the average compression ratio does not exceed a predetermined threshold value, waiting a predetermined sample period and then repeating steps (b)-(d); and
    (f) at the end of the data stream, transmitting from said device the data stream via the wireless communications channel.

6. A computer-readable medium as described in claim 4, further comprising computer-executable instructions for performing the step of waiting a predetermined sample period and then repeating steps (b)-(c) if the average compression ratio does not exceed a predetermined threshold value.

7. A computer-readable medium as described in claim 4, wherein the computer-readable medium is present on a network interface device that is capable of interfacing with a host computing device and is further capable of wirelessly transmitting the data stream via a wireless channel.

8. A method for transmitting a data stream via a communications network, the method comprising the following steps:
    (a) continuously computing at a wireless network interface device an average compression ratio value for a corresponding portion of a data stream;
    (b) compressing at said device a portion of the data stream using a predetermined compression algorithm where the corresponding average compression ratio exceeds a predetermined threshold value, said portion comprising at least one network protocol data packet;
    (c) passing a portion of the data stream where the corresponding average compression ratio falls below a predetermined threshold value; and
    (d) at the end of the data stream, transmitting from said device the data stream via a wireless communications channel.

9. A computer-readable medium having computer-executable instructions for performing the steps recited in claim 8.

* * * * *